United States Patent [19]

Cleeves et al.

[11] Patent Number: 5,366,929
[45] Date of Patent: Nov. 22, 1994

[54] METHOD FOR MAKING RELIABLE SELECTIVE VIA FILLS

[75] Inventors: James M. Cleeves, Redwood City; Changhae Park, Santa Clara; Rosemary Gettle, San Jose, all of Calif.

[73] Assignee: Cypress Semiconductor Corp., San Jose, Calif.

[21] Appl. No.: 68,900

[22] Filed: May 28, 1993

[51] Int. Cl.$^5$ .............................. H01L 21/44
[52] U.S. Cl. .................... 437/195; 437/203; 437/192; 437/231; 148/DIG. 158
[58] Field of Search ........... 437/192, 195, 203, 231, 437/235; 148/DIG. 158

[56] References Cited

U.S. PATENT DOCUMENTS 4,666,737  5/1987  Gimpelson et al. .............. 437/203

FOREIGN PATENT DOCUMENTS

0065852  3/1989  Japan ............................. 437/203

Primary Examiner—Tom Thomas
Assistant Examiner—Tuan Nguyen
Attorney, Agent, or Firm—Blakely, Sokoloff, Taylor & Zafman

[57] ABSTRACT

A process for filling vias formed in a dielectric layer is disclosed. First, a via is formed in a dielectric layer, exposing an underlying metallization layer having a seed layer thereon. A sputter etch is performed which removes a portion of the seed layer, including an oxidized surface layer. The material thus etched from the seed layer first seals the sidewall of via, preventing outgassing from occurring. The continued redeposition of the seed layer on the sidewall provides a nucleation site for selective deposition of a via fill material. Following the sputter etch, selective deposition of the via fill is performed. Since the deposition occurs from the sidewalls as well as on the bottom of the via, all vias become substantially filled at the same time.

12 Claims, 6 Drawing Sheets

METHOD FOR MAKING RELIABLE SELECTIVE VIA FILLS

FIELD OF THE INVENTION

The present invention relates to semiconductor device processes, and more particularly, to a method of filling openings in a dielectric layer.

BACKGROUND OF THE INVENTION

In the manufacture of semiconductor devices, it is necessary to make electrical contact to certain regions or layers of the device. Typically, it is necessary to make contact to a region underlying a dielectric layer formed on the surface of a wafer during processing by first forming an opening or via in the dielectric over the region to be contacted. The opening may expose a device region within the silicon substrate, such as a source or drain, or may expose some other layer or structure, for example, an underlying metallization layer, local interconnect layer, or structure such as a gate. After the opening has been formed, thus exposing a portion of the region or layer to be contacted, the opening is filled with a conductive material deposited in the opening and in electrical contact with the underlying layer. In some cases, the fill material can be deposited and patterned coincidentally with the metallization for that layer. However, as geometries shrink, and the resulting openings in the dielectric layer have increasingly greater aspect ratios, filling the openings with the metallization layer becomes increasingly problematic.

To overcome the shortcomings involved in filling the openings with the metallization layer, a via fill process is employed, wherein a conductive plug of material is deposited in the vias prior to metallization. One approach is to use a blanket deposition and etchback. For example, a blanket tungsten layer is deposited, which fills all vias, and additionally coats the surface of the wafer. Typically, due to the high aspect ratios of the openings, the top surface is relatively planar, compared to the depressions in the underlying surface. The deposition is followed by a blanket etchback to remove the deposited tungsten from the surface of the substrate, leaving a tungsten filling or plug in the openings. The fill process is then followed by normal metallization to make contact to the fill material, thereby coupling the underlying region to the metallization. The tungsten is typically deposited by CVD using tungsten hexafluoride ($WF_6$). One problem with this method is that a substantial amount of unused tungsten is formed and then etched from the surface of the wafer. Unfortunately, $WF_6$ is a relatively expensive material, so that the cost of filling the vias is high relative to the small amount of tungsten actually remaining as part of the device. Another problem with the blanket deposition and etchback of tungsten is the microloading effect, wherein the etch rate drastically accelerates in the openings when the bulk of the film has been removed from the surface of the wafer, as is well known. A further problem with the blanket deposition and etchback of tungsten is poor adhesion due to the high internal stress of the blanket film. Finally, this method requires two processing steps (deposition and etch) and typically two different systems, to accomplish.

Another method for filling the vias is to employ a selective fill process. Depending upon the underlying material, various materials can be selectively deposited in the vias including, for example, doped polysilicon or metals such as tungsten, copper and nickel. When tungsten is used as the via fill, it is typically deposited on, for example, a titanium, titanium tungsten (TiW), or titanium nitride (TIN) seed layer which was deposited on the underlying region or metallization layer, for example, during previous processing steps. In order to grow a selective tungsten which completely fills the via, and which does not have unreasonably high contact resistivity, the seed layer quality must be carefully controlled. The seed layer cannot have any contamination such as polymer films or other organic material. Additionally, the TiW film should have no oxide formed thereon. However, it is difficult to maintain an oxide-free seed layer. For example, the methods used to remove polymer from the TiW seed layer tend to oxidize the TiW. A further problem encountered in selective fill process is that the dielectric layer through which the via is formed, often outgasses through the sidewall of the via, leading to contamination of the seed layer at the bottom of the via. An outgassing step after via formation, and prior to any seed layer clean may be performed to lessen the extent of outgassing. However, it is typically not possible to completely stop all outgassing from occurring during the via fill process.

Another problem with the selective fill method is that the selective fill grows from the bottom up, so that, in wafers having vias of varying depth, deep vias are not completely filled, while shallow vias become overfilled.

What is needed is a method of filling vias which utilizes the advantage of selective fill deposition, which provides for a contamination and oxide free seed layer, and which eliminates or reduces outgassing from the dielectric layer through the sidewall. Further, it is desirable that the method provide for uniform filling of the vias, regardless of their depth.

SUMMARY OF THE INVENTION

The present invention provides for uniform filling of vias or openings in a dielectric layer. First, a dielectric layer is deposited on an underlying layer. Next, openings are formed in the dielectric layer to expose regions of the underlying layer to be contacted. Finally, a fill is selectively deposited in the via according to the present invention.

Prior to selective deposition, a sputter etch is carried out. As the surface of the underlying layer is etched, the etched material is ejected at angles typically less than 90°. This low angle material coats the surface of the via sidewall. This coating prevents outgassing during the subsequent selective deposition. Additionally, since the etched material is a seed layer for selective deposition, the coating on the sidewall provides a seed location on these sidewalls in addition to the bottom of a via. After etch, the wafers are next processed through selective deposition. Since the sidewalls now contain a nucleation site, the selective deposition occurs from the sides as well as the bottom of the via. This growth from the vertical sidewalls results in openings that become full at the same time, independent of depth.

Other features and advantages of the present invention will become apparent from the detailed description, figures, and claims which follow.

DETAILED DESCRIPTION

A method for making reliable selective vias is disclosed. In the following description, numerous specific details are set forth such as specific materials, structures, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, although the present invention is described in conjunction with a selective tungsten fill deposited by chemical vapor deposition (CVD), it will be appreciated that the present invention is equally applicable to CVD deposition of other materials such as, for example, doped polysilicon and copper, as well as to deposition of various materials including, for example, copper and nickel, by other methods such as, for example, plating processes.

Figure 1:
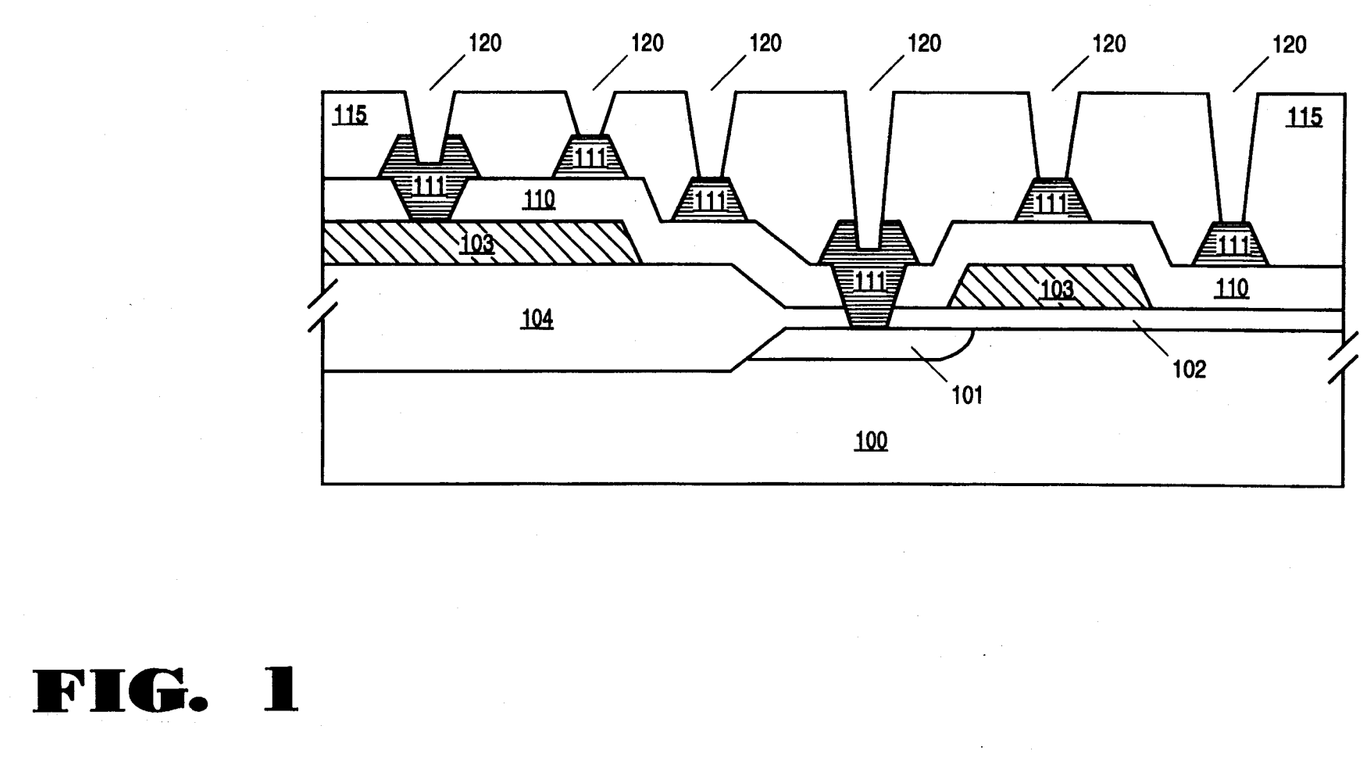
FIG. 1 shows a cross-section elevation view of an example of a semiconductor device during fabrication having vias in an intermetal dielectric layer.

FIG. 1 shows an example of a semiconductor device during fabrication upon which the present invention may be practiced. It will be understood that FIG. 1 is used to illustrate the types of structures that may be present in practicing the present invention, and that the present invention is not limited to the structure of FIG. 1 or devices utilizing such a structure, but instead is applicable to filling any type of via in any type of device or structure. FIG. 1 shows semiconductor substrate 100, which can be either p- or n-type, and heavily doped diffusion region 101, such as a source or drain, which is heavily doped with the opposite dopant type of the substrate. Also shown is gate dielectric 102, polysilicon layer 103, interlevel dielectric 110, and first metallization layer 111. As shown in FIG. 1, intermetal dielectric 115 is a completely planarized dielectric layer. While the present invention can be utilized in any fill process, the present invention is particularly beneficial in devices having such a planarized dielectric layer 115. A plurality of vias 120 have been formed in dielectric layer 115 in order to expose first level metallization layer 111 in several locations. As can be seen, the various metallization layer 111 surfaces to be contacted are at differing levels on the device. Because dielectric layer 115 has been planarized, this results in the plurality of vias 120 having different depths, as shown, depending upon the level of metallization layer 111.

Dielectric layer 115 may comprise a single oxide, or several layers formed by various methods. For example, one or more layer of oxide may be deposited by plasma enhanced chemical vapor deposition (PECVD), thermal CVD (TCVD), atmospheric pressure CVD (APCVD), subatmospheric pressure CVD (SACVD), for example, utilizing, for example, tetraethyl orthosilicate (TEOS) and oxygen or TEOS and ozone chemistries. As used herein, reference to, for example, a PECVD TEOS oxide denotes an oxide layer deposited by PECVD utilizing TEOS chemistry. Additionally, one or more layers of dielectric layer 115 may be a spin-on-glass (SOG) layer. SOG oxides, some TCVD oxides, and oxides formed using ozone typically have a high water content and will outgas extensively during subsequent processing. However, the dielectric layer 115 typically contains at least one layer of spin-on-glass and/or a TCVD oxide layer because these oxides are known to have excellent gap filling properties, and are therefore helpful in forming a planarized layer. Although the dielectric 115 may contain an upper layer of, for example, PECVD oxide, which does not outgas to nearly the extent of the TCVD oxide or SOG, a portion of any TCVD or SOG layer present in dielectric layer 115, will be exposed along the sidewalls of the vias 120. Therefore, outgassing can easily occur during the via fill deposition process. Often, an outgas step is performed prior to selective deposition in the vias 120. Unfortunately, however, the SOG or TCVD oxide can be expected to continue outgassing during the fill deposition process, even when an outgas step is performed prior to deposition. Additionally, the outgas step tends to oxidize the seed layer. To overcome these problems, an etchback can be performed during formation of dielectric layer 115 to ensure that, for example, only a PECVD oxide layer is exposed along the sidewalls of vias 120. Alternatively, following formation of vias 120, a deposition and anisotropic etchback of a PECVD oxide can be performed to form sidewall spacers along the sidewalls of vias 120. However, these methods result in more costly and complex processing. Additionally, even the PECVD oxide can be expected to outgas to some extent.

The selective deposition conventionally proceeds by depositing the fill material on the surfaces of metallization level 111 exposed by vias 120. Typically, metallization level 111 contains a seed layer (not shown in FIG. 1) which is deposited and patterned coincidentally with metallization level 111. In order to deposit a high quality fill, the seed layer cannot have any contaminants or an oxide layer on it. As described earlier, the cleaning methods used to remove contaminants may oxidize the seed layer. Additionally, the various cleans or processes used to remove contaminants and/or oxide frequently leave residues in the field area which are unwanted seeds for selective deposition, thereby leading to shorts or other problems.

Figure 2:
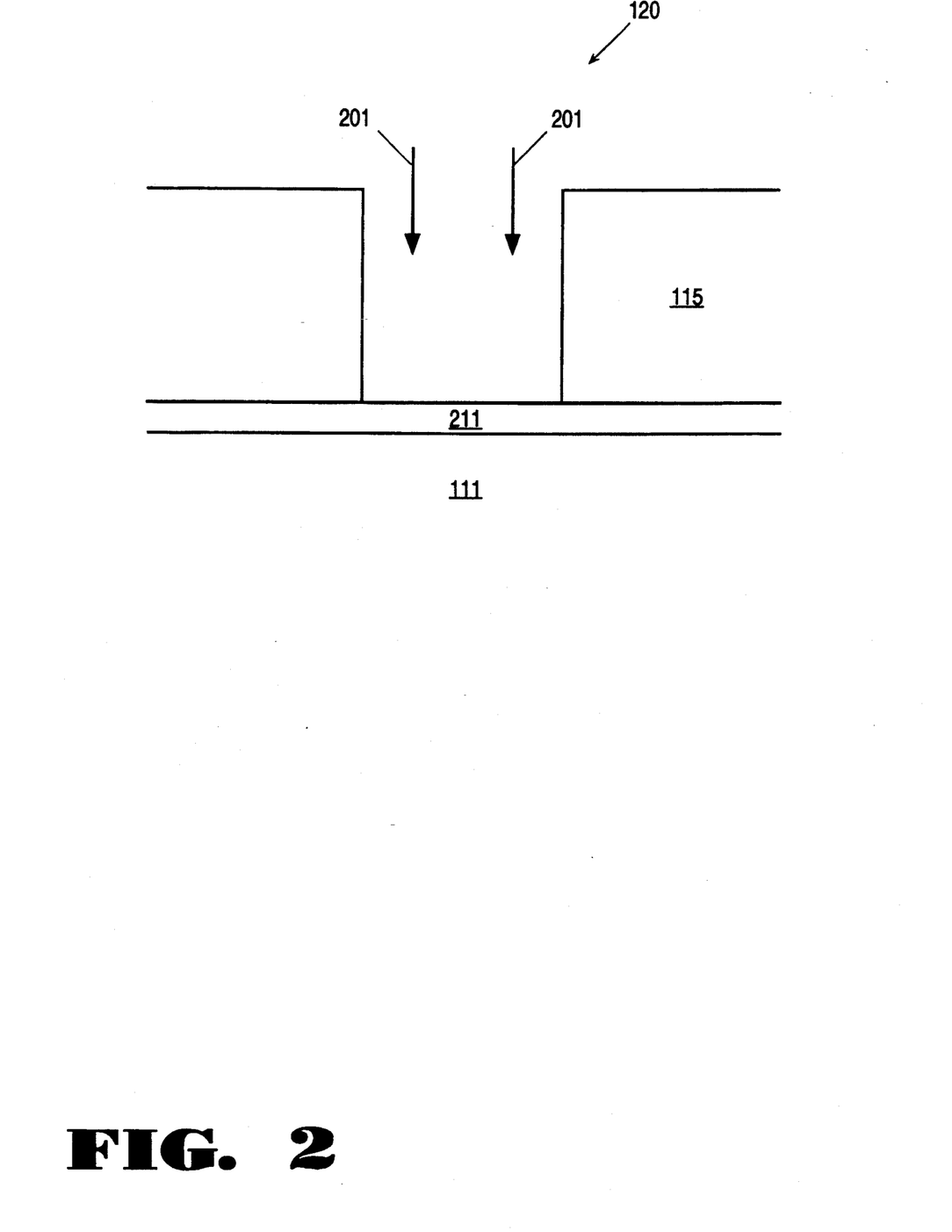
FIG. 2 shows a cross-section elevation view of a representative via in a dielectric layer to be filled by the method of the present invention.

FIG. 2 shows a close-up cross-sectional view of one of the vias 120 of FIG. 1. Also shown in FIG. 2 is seed layer 211 overlying the metallization layer 111. In a currently preferred embodiment, metallization layer 111 comprises any of the typical metallization materials such as, for example, an aluminum alloy. Alternatively, metallization layer 111 may comprise other materials such as tungsten (W), copper (Cu), or gold (Au). Also in a currently preferred embodiment, seed layer 211 comprises titanium tungsten (TiW), having a thickness in the range of approximately 1000–1500 Å. Other seed layers such as tungsten, or titanium nitride (TiN), for example, could also be used. The seed layer is selected such that the desired contact fill can grow upon it. For example, aluminum typically cannot be used as a seed layer for selective tungsten, because aluminum fluoride is formed when depositing with tungsten hexafluoride ($WF_6$). The seed layer can be any of a variety of materials so long as it is compatible with the process and material of the fill used. Seed layer 211 may not be necessary, if metallization 111 is made of a material upon which the subsequently deposited fill can grow. As a further alternative, a silicide may be used as a seed layer, if the silicide can serve as a nucleation site for the subsequent fill deposition. In such a case, where vias 120 expose a region comprising silicon, a self-aligned silicidation process can be utilized to form the seed layer for subsequent fill deposition.

FIG. 2 also illustrates the novel sputter etch performed in the present invention. In FIG. 2, the sputter etch is shown as arrows 201 for illustration. In the present invention, any cleaning or outgassing or other similar pre-selective deposition processing may be carried out prior to the sputter etch of the present invention. In a currently preferred embodiment, the sputter etch is carried out in an atmosphere of argon, at 8 mTorr pressure, with a 1000 volt bias. In a currently preferred embodiment, the sputter etch is carried out in a commercially available system such as the Varian 3180 or 3290 systems, for example. Alternatively, any system having a sputter etch mode may be used to practice the present invention. As will be appreciated by one skilled in the art, these parameters can be varied considerably while still achieving the objects of the present invention. In a currently preferred embodiment, the etch is designed to etch approximately 200 Å per minute as measured on thermal oxide. The etch rate of a TiW seed layer 211 can be expected to be somewhat higher, approximately in the range of 200–270 Å/min per minute. In a currently preferred embodiment, this etch is carried out for two minutes. As is well known, the argon ions impinging on the surface of seed layer 211 typically arrive normal to the surface. However, the material etched from seed layer 211 is typically ejected from the surface at a wide range of angles. Therefore, the material removed from seed layer 211 strikes the sidewalls of via 120. At the beginning of the etch, any oxidized portion of the seed layer is removed first and is the first layer to coat the sidewalls of via 120. After an initial, thin layer has been formed on the sidewalls of via 120, the sidewalls are essentially sealed and do not further outgas significantly. Thus, as the sputter etch proceeds, no further contaminants are introduced from outgassing, and the TiW etched from the surface of seed layer 211 and deposited on the sidewalls of via 120 remains relatively clean.

Figure 3:
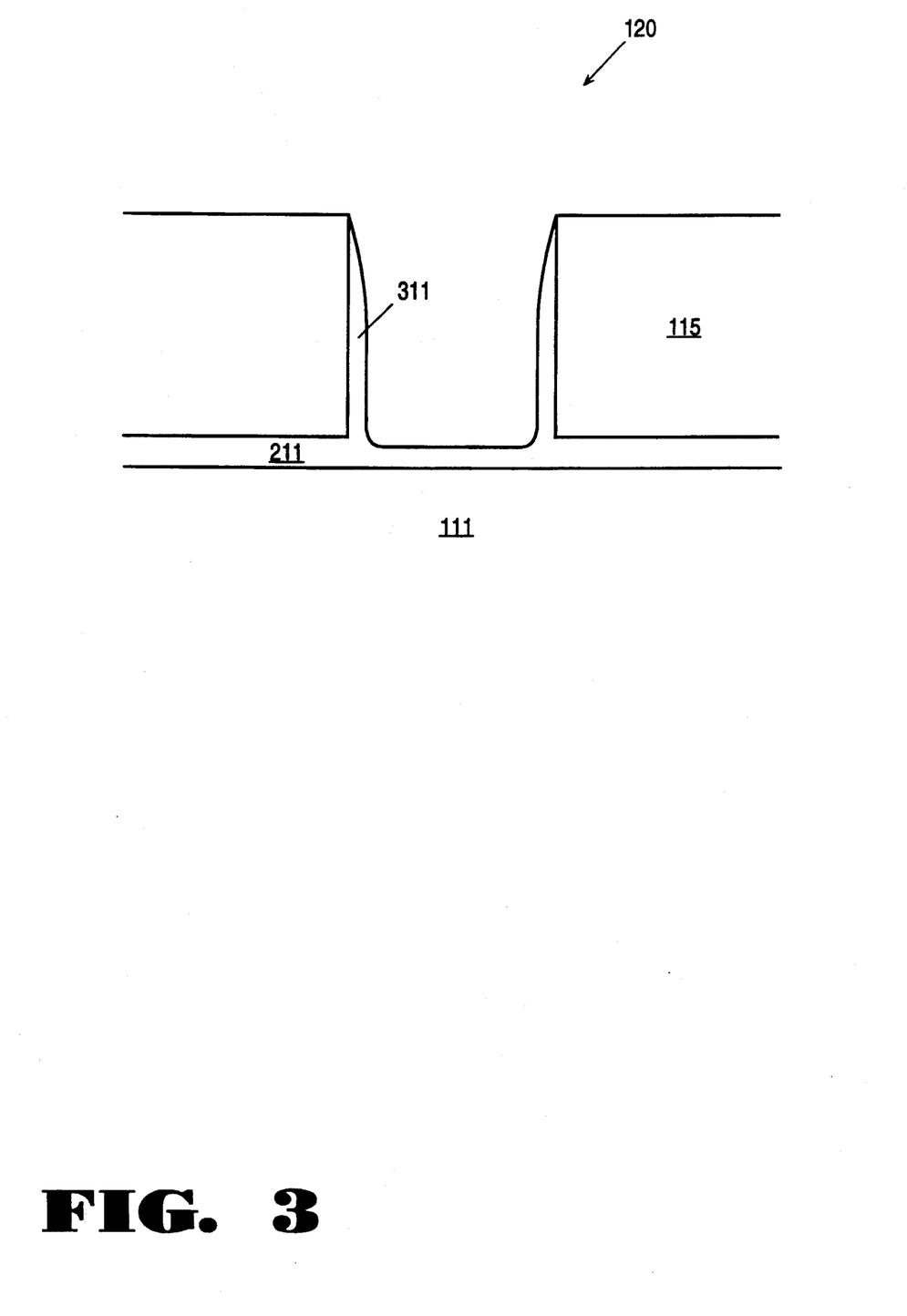
FIG. 3 shows the via of FIG. 2 after sputter etch according to the present invention.

FIG. 3 shows the structure of FIG. 2 after the sputter etch described in relation to FIG. 2 has been completed. As shown, in the region exposed by via 120, a portion of seed layer 211 has been etched away. In a currently preferred embodiment approximately 500 Å will have been etched from this region. Also shown in FIG. 3 is sidewall coating 311 which comprises material etched from seed layer 211 in the region exposed by via 120. As described above, the portion in direct contact with the sidewall of via 120 touching dielectric layer 115, comprises primarily the oxidized TiW that formed the uppermost surface of seed layer 211 exposed by via 120. Since the sidewall of via 120 is sealed during the initial stages of the sputter etch of the present invention, all of the surfaces of sidewall coating 311, as well as the exposed portion of seed layer 211 comprise a clean, non-oxidized surface of the material of the seed layer 211. At this point, the exposed seed layer 211 and sidewall coating 311 provide a nucleation site for the subsequent selective deposition.

Following the sputter etch process described above, the wafer is processed through selective tungsten deposition. In a currently preferred embodiment, the selective tungsten deposition is performed by decomposition of tungsten hexafluoride ($WF_6$) in a cold wall CVD system with lamp heating. Since the room temperature oxidation rate of TiW is very low, the exposed portion of seed layer 211 and sidewall coating 311 remain clean and essentially non-oxidized prior to selective deposition. If desired, the system used for selective deposition can also be used to perform an in-situ sputter etch, provided it has this capability. For example, a cluster or modular system could be used to first perform the sputter etch, and then the deposition of the present invention. As an alternative, other types of CVD systems/processes could be used. For example a thermal CVD, or a plasma enhanced CVD selective deposition could be used in the practice of the present invention. As used herein, CVD deposition refers to any of these or other chemical vapor depositions. The methods of selectively depositing are well known in the art.

Figure 4:
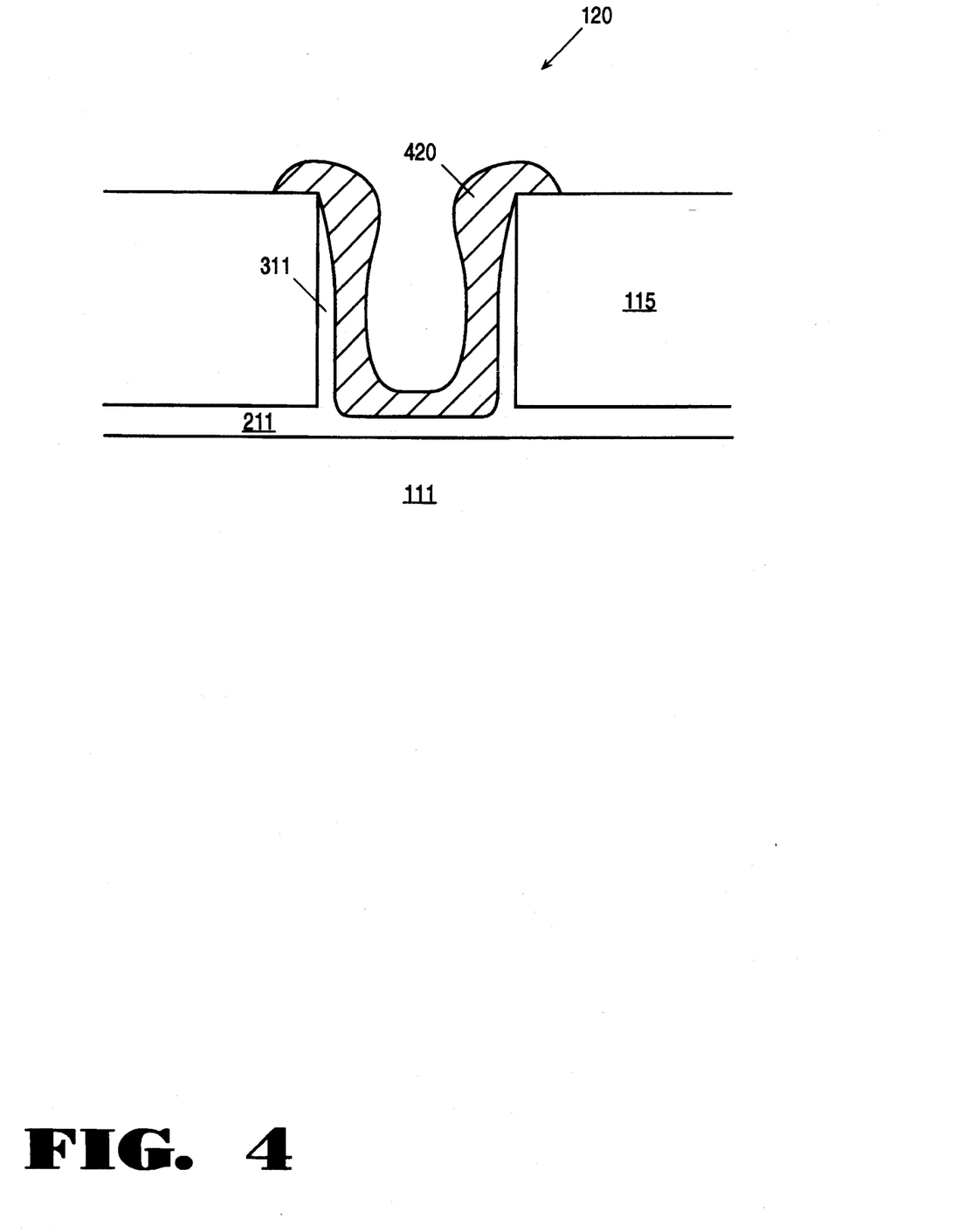
FIG. 4 shows the via of FIG. 3 during selective deposition.

FIG. 4 shows growth of the via fill 420 at some point during the deposition process. As shown, the fill grows on sidewall coating 311 along the sidewalls of via 120, as well as from the surface of seed layer 211 at the bottom of via 120. The deposition proceeds essentially isotropically from this point. However, as shown, the selective W deposition depletes in the lower region of the via to some extent, resulting in slightly less deposition in this area.

Figure 5:
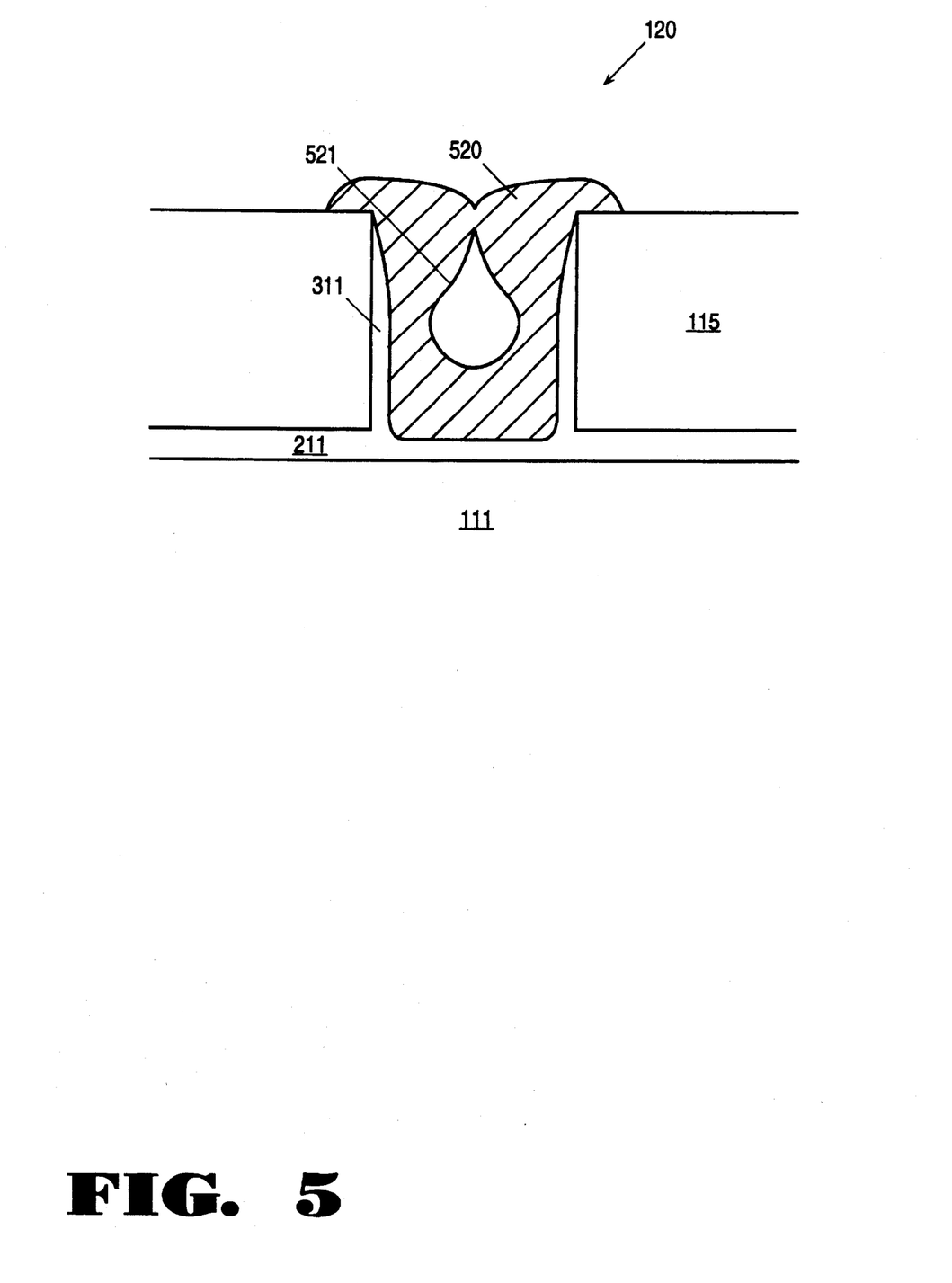
FIG. 5 shows the via of FIG. 3 after selective deposition of the fill material.

Referring now to FIG. 5, via 120 is shown completely filled with via fill 520, which in the case of the currently preferred embodiment comprises tungsten. As a result of the slightly lower deposition rate in the lower portion of the via 120, a small void 521 results as shown. The void 521 is similar to typical voids present in many prior art selective depositions, and has no adverse effect on processing or device performance. If desired, the selective deposition can be adjusted to reduce or eliminate the void 521. Also as shown, a slight overfill occurs resulting in the fill 520 extending out of the via 120.

As noted above, selective tungsten deposition proceeds from the bottom and sidewalls of the vias 120. Because of this, all of vias 120 will become full at approximately the same time, regardless of their depth. As mentioned previously, in prior art methods wherein the deposition proceeds from the bottom up, shallow vias become filled sooner than deeper ones, so that a substrate such as that shown in FIG. 1 will have some vias that are underfilled, which can result in poor electrical contact to the subsequent metallization layer, and others which are overfilled resulting in an uncontrolled mushrooming effect. However, in the present invention, neither of these problems occur because the diameters of the various vias 120 are much more uniform than their depth. Thus, the overfilling shown in FIG. 5 is both minimal and uniform from via to via.

Figure 6:
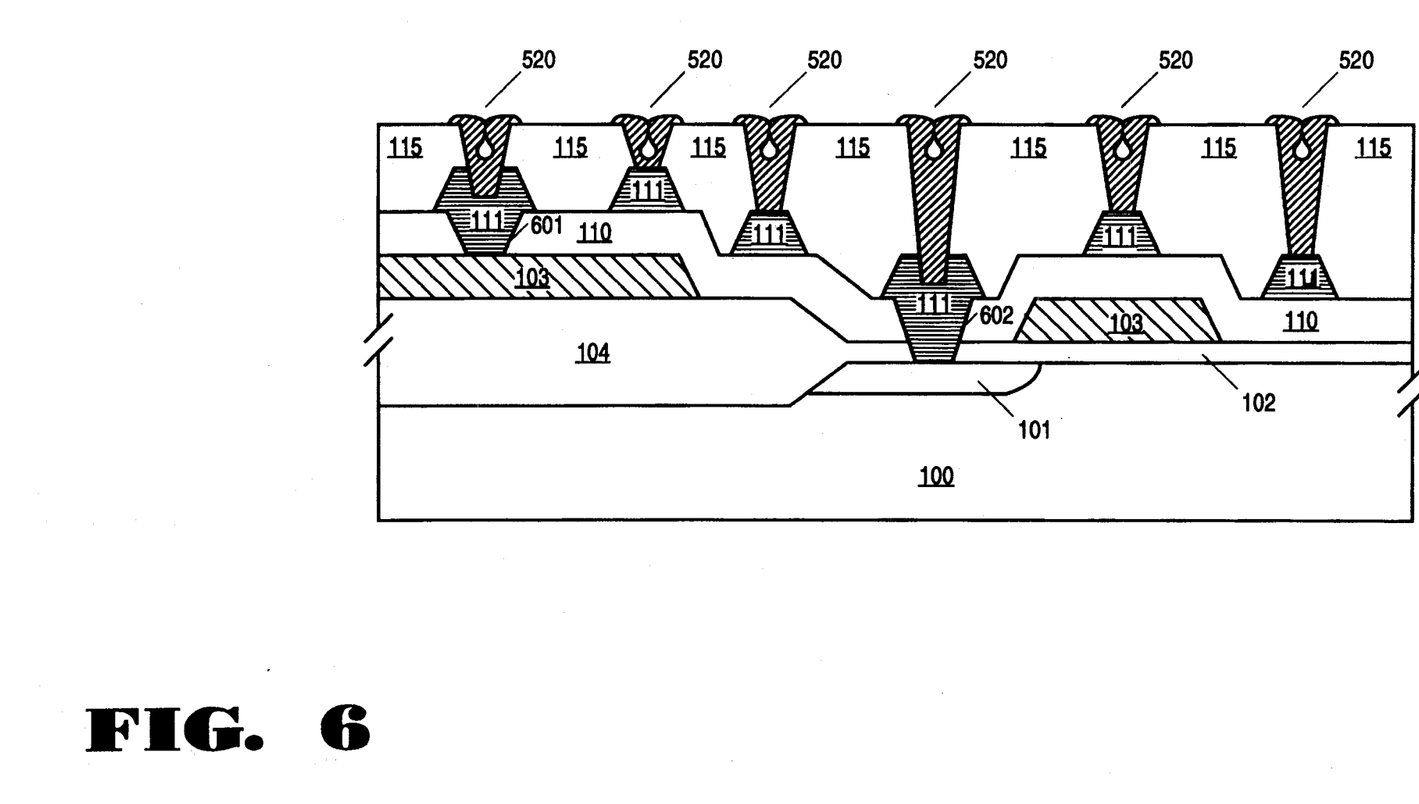
FIG. 6 shows the semiconductor device of FIG. 1 after the via fill method of the present invention has been practiced.

Referring to FIG. 6, the structure of FIG. 1 is shown after the sputter etch and selective deposition of the present invention has been performed. As can be seen, each of the vias 120 is substantially filled with via fill 520. As shown, all vias are filled to a uniform height.

After the point in processing shown in FIG. 6, a second metallization will typically be deposited, patterned, and etched. The second level of metallization is thus coupled to the first level of metallization, where appropriate, through via fill 520. Next, well known processing steps are performed in order to complete the device.

The present invention is not restricted to the particular device or level shown. As an example, subsequent metallizations may need to be contacted through dielectrics deposited on them. The present invention is equally applicable to be performed in filling these subsequent vias. Additionally, it will be noted that in FIGS. 1 and 6, the first level metallization is used to fill vias in the interlevel dielectric 110, such as vias 601 and 602. These openings may alternatively be selectively filled using the method of the present invention. For example, the sputter etch of the present invention followed by selective deposition of an appropriate fill can be performed prior to deposition of metallization layer 111. With regard to via 602 however, the invented process may not be desirable, as some damage may be introduced into semiconductor substrate 100 in diffusion region 101. Additionally, the sputter etch of the present invention may affect the doping characteristics of the region 101. However, with, for example, a silicide seed layer, such a process may be feasible as long as the material used to fill via 602 will grow on a silicide seed layer. In the case of an underlying polysilicon layer such as for via 601, no seed layer may be necessary, so long as the silicon acts as a nucleation site for the subsequently deposited fill. For example, selective polysilicon or selective tungsten could be deposited as the via fill.

In the present invention, the vias 120 have a depth in the range of approximately 0.5–1.0 microns. The sputter etch parameters described above, performed on a TiW seed layer have been found to be sufficient to completely coat the sidewalls of the vias 120 with coating 311. It will be appreciated that some modification may be needed to the sputter etch process, in order to provide for a coating 311 which seals the sidewalls and provides for a nucleation site, in the case of other materials and/or different via depths. For example deeper/higher aspect ratio vias will likely need more sputter etch than shallower/lower aspect ratio vias. Also the sputter etch may need to be adjusted to take into account the etch rate of the material of the seed layer. Finally, oxides which outgas to a great extent will need a greater sidewall 311 thickness than oxides which outgas to a lesser extent. The parameters described herein have been found to be satisfactory for the materials, structures, and dimensions described herein. For other materials, structures and/or dimensions, the optimum parameters can be found by experimentation. For example the sputter etch time can be varied, to determine the optimum amount of sputter etch. If the sputter etch is insufficient, upon optical or SEM inspection following selective deposition, some vias will be underfilled or completely unfilled. Conversely, a sufficient sputter etch will result in all vias being substantially uniformly filled.

Thus, a novel method of filling openings in a dielectric layer has been described. In the present invention the sidewalls of the vias are sealed such that contaminants from outgassing are greatly reduced or eliminated. Also in the present invention, selective deposition occurs from the sidewalls of the vias as well as the bottoms, so that all vias are filled approximately simultaneously, regardless of depth.

What is claimed is:

1. A method of treating openings in a dielectric layer comprising the steps of:
    depositing said dielectric layer on an underlying layer, said dielectric layer comprising an insulative material selected from the group consisting of spin-on-glass and a thermal chemical vapor deposited oxide;
    forming a plurality of said openings in said dielectric layer, each of said openings exposing a region of said underlying layer, each of said openings having a sidewall, said sidewall exposing said insulative material, and wherein at least one of said openings has a depth different from another of said openings;
    performing an etch such that material from said region is deposited on said sidewall.

2. The method as described in claim 1 wherein said region comprises a material selected from the group consisting of titanium nitride, titanium tungsten, tungsten and any combination thereof.

3. The method as described in claim 2 wherein said etch is a sputter etch.

4. The method as described in claim 1 wherein said etch is a sputter etch.

5. A method of filling openings in a dielectric layer comprising the steps of:
    depositing said dielectric layer on an underlying layer, said dielectric layer comprising an insulative material selected from the group consisting of spin-on-glass and a thermal chemical vapor deposited oxide;
    forming a plurality of said openings in said dielectric layer, each of said openings exposing a region of said underlying layer, each of said openings having a sidewall, said sidewall exposing said insulative material, and wherein at least one of said openings has a depth different from another of said openings;
    performing an etch such that a first material from said region is deposited on said sidewall;
    filling said openings with a second material.

6. The method as described in claim 5, wherein said step of filling said openings with a second material comprises a selective deposition of said second material.

7. The method as described in claim 6 wherein said second material comprises a material selected from the group consisting of tungsten, copper nickel, and polysilicon.

8. The method as described in claim 7 wherein said etch is a sputter etch.

9. The method as described in claim 7 wherein said selective deposition is performed by a method selected from the group consisting of selective CVD deposition and selective plating.

10. The method as described in claim 6 wherein said selective deposition is performed by a method selected from the group consisting of selective CVD deposition and selective plating.

11. The method as described in claim 5 wherein said etch is a sputter etch.

12. The method as described in claim 11 wherein said selective deposition is performed by a method selected from the group consisting of selective CVD deposition and selective plating.

\* \* \* \* \*